United States Patent [19]

Tsai et al.

[11] Patent Number: 5,252,515
[45] Date of Patent: Oct. 12, 1993

[54] METHOD FOR FIELD INVERSION FREE MULTIPLE LAYER METALLURGY VLSI PROCESSING

[75] Inventors: Lih-Shyng Tsai; Jiunn-Jyi Lin; Kwang-Ming Lin, all of Hsin-Chu; Shu-Lan Ying, Pan-Chiau, all of Taiwan

[73] Assignee: Taiwan Semiconductor Manufacturing Company, Hsinchu, Taiwan

[21] Appl. No.: 743,779

[22] Filed: Aug. 12, 1991

[51] Int. Cl.[5] .................. H01L 21/441; H01L 21/469
[52] U.S. Cl. ..................................... 437/195; 437/231; 437/238; 437/241; 437/978
[58] Field of Search ............... 437/978, 195, 231, 238, 437/241

[56] References Cited

U.S. PATENT DOCUMENTS 4,986,878  1/1991  Malazgirt et al. ................ 156/643
5,003,062  3/1991  Yen ...................................... 437/231

FOREIGN PATENT DOCUMENTS 192137  8/1989  Japan ................................. 437/231

OTHER PUBLICATIONS

Pramanik et al, "Field Inversion in CMOS Double Metal Circuits...," VMIC Conference, Jun. 12 & 123, 1989, pp. 454-462.

Primary Examiner—John S. Maples
Attorney, Agent, or Firm—George O. Saile

[57] ABSTRACT

A multiple layer metallurgy, spin-on-glass multilayer metallurgy structure and method for making such structure for a one micrometer or less feature size integrated circuit with substantially free field inversion on a semiconductor substrate having a pattern of device regions therein. A passivation layer is located over the surfaces of the patterns. A pattern of openings are made through the passivation layer to at least some of the device regions which include source/drain regions. A patterned first metallurgy layer is in contact with the pattern of openings. A first via dielectric layer is located over the pattern of first metallurgy layer. A silicon-rich barrier dielectric layer is located over the first layer. A cured spin-on-glass layer is over the barrier layer. A silicon oxide second via dielectric layer is over the spin-on-glass layer. A pattern of openings is in the second via layer, spin-on-glass layer, barrier layer and first via layer. A patterned second metallurgy layer is in contact with the pattern of openings to make electrical contact with the first metallurgy layer wherein the multilevel metallurgy integrated circuit with substantially free field inversion is completed.

20 Claims, 2 Drawing Sheets

METHOD FOR FIELD INVERSION FREE MULTIPLE LAYER METALLURGY VLSI PROCESSING

BACKGROUND OF THE INVENTION

(1) Field of the Invention

The present invention relates to method for making multiple layer metallurgy such as double metal, spin-on-glass multilevel metallurgy device structures which are substantially free of field inversion.

(2) Description of the Prior Art

Multiple layer metallurgy such as double metal, spin-on-glass multilevel metallurgy is now used in high density integrated circuits for electrical connection to the device elements located in and on semiconductor substrate. Spin-on-glass is a very desirable material to be used in such methods and resulting structures to overcome the irregularity or substantially nonplanar surfaces of the first level of metallurgy. This irregular or nonplanar surface problem causes loss of resolution in the lithographic masking processing. The problem increases with higher level of metallurgy.

These problems have been recognized in the prior art and attempts have been made to overcome these topographical problems principally in the one micron and above feature dimensions. These techniques can be generally grouped in categories of planarization either involving etchback or nonetchback techniques.

In the case of etchback processing, typically a coating is formed on top of the irregular surfaces by an means of spin-on-glass or thermoplastic deposition techniques which produces a planar surface. A plasma, reactive or chemical wet etching is used uniformly across the planar surface to remove the deposited layer and the tops of the irregular humps or the like to produce a planar surface at the desired depth.

In the early nonetchback processing, the usual technique was to heat the dielectric layer, which was typically glass until the flow of the glass reduced the irregularities.

More recently the nonetchback planarization using a spin-on-glass sandwich has found interest at the about one micron feature dimension integrated circuit processing. This technique is described in U.S. Pat. No. 5,003,062 to Daniel L. Yen and assigned to the same assignee of the present invention. In this patent a sandwich dielectric structure is formed and used in one micron or less processing of spin-on-glass sandwiched between two silicon oxide layers. The spin-on-glass layer functions as the means for planarizing the irregularities.

In the Yen U.S. Pat. No. 5,003,062, spin-on-glass that has been cured still remains in the final product. However, workers in the field such as A. Malazgirt et al U.S. Pat. No. 4,986,878 has found that spin-on-glass even after curing by conventional techniques causes reliability problems, such as the presence therein of mobile ions, e.g. sodium to the point that they use the spin-on-glass in an etchback process for planarization and then completely remove the remaining material. Then a conventional insulator is deposited.

In the paper entitled "FIELD INVERSION IN CMOS DOUBLE METAL CIRCUITS DUE TO CARBON BASED SOGS" by D. Pramanik et al, a further discussion of the reliability problems in the use of spin-on-glass (SOG) is considered. They conclude that the use of SOG must be heavily restricted to overcome field inversion, that is a positive charge build up between the SOG layer and the other dielectric layers. They state that SOG must be purely inorganic phosphosilicate glass, since organic based SOG emanates hydrogen. Further, the require that etchback be used to reduce the thickness of the SOG to the bare minimum in the final product. Still further, they require that the layer covering the SOG be formed of a material that does not liberate hydrogen, such as silicon dioxide. Normal processes for depositing silicon nitride or oxynitride do liberate hydrogen.

It is a principal object of the present invention to provide a method and resulting device which do not have the restrictions for the use of SOG that the prior art require.

It is a further object of the present invention to provide methods involving the formations of a dielectric barrier layer below the SOG composite layer which allows the use of organic based SOG materials and makes the use of any etchback of the SOG unnecessary.

SUMMARY OF THE INVENTION

In accordance with the present invention, a method for forming multiple layer metallurgy, spin-on-glass multilayer metallurgy for a one micrometer or less feature size integrated circuit with substantially free field inversion, that is the positive charge between the first via layer and the SOG is described. A semiconductor substrate having a pattern of field effect device source/drain regions therein with a pattern of gate dielectric and gate electrode structures associated therewith and a pattern of field isolation structures at least partially within said semiconductor substrate electrically separating certain of these source/drain regions from one another are provided. A passivation layer is formed over the surfaces of said patterns. Then the multilayer metallurgy is formed thereover by opening a pattern of openings through the passivation layer to at least some of the source/drain regions, depositing and patterning a first metallurgy layer in contact with the pattern of openings, forming a first via dielectric layer over the pattern of first metallurgy layer, forming a silicon-rich barrier dielectric layer over said barrier layer, forming a spin-on-glass layer over the barrier layer and curing the layer, forming a second via dielectric layer over the spin-on-glass layer, forming a pattern of openings in the second via layer, the spin-on-glass layer, barrier layer and the first via layer, and depositing and patterning a second metallurgy layer in contact with the pattern of openings to make electrical contact with the first metallurgy layer wherein the multilevel metallurgy integrated circuit with substantially free field inversion is completed.

Further in accordance with the invention, there is provided a multiple layer metallurgy, spin-on-glass multilayer metallurgy structure for a one micrometer or less feature size integrated circuit with substantially free field inversion on a semiconductor substrate having a pattern of device regions therein. A passivation layer is located over the surfaces of the patterns. A pattern of openings are made through the passivation layer to at least some of the device regions which include source/drain regions. A patterned first metallurgy layer is in contact with the pattern of openings. A first via dielectric layer is located over the pattern of first metallurgy layer. A silicon-rich barrier dielectric layer is located over the first layer. A cured spin-on-glass layer is over the barrier layer. A silicon oxide second via dielectric layer is over the spin-on-glass layer. A pattern of openings is in the second via layer, spin-on-glass layer, barrier layer and first via layer. A patterned second metallurgy layer is in contact with the pattern of openings to make electrical contact with the first metallurgy layer wherein the multilevel metallurgy integrated circuit with substantially free field inversion is completed.

DESCRIPTION OF THE PREFERRED EMBODIMENTS

Figure 1:
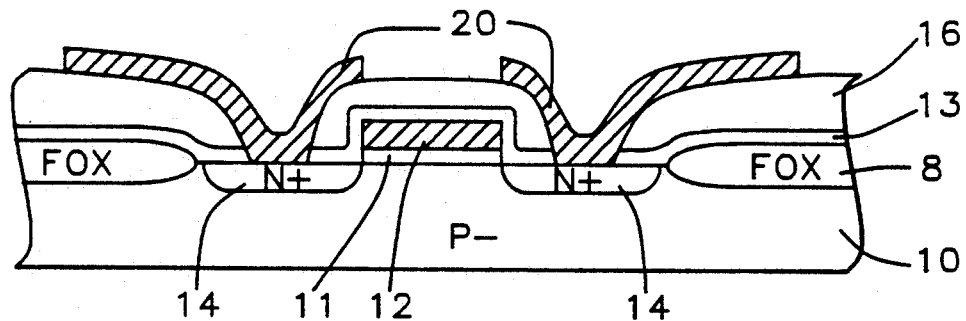
FIGS. 1 and 2 are schematic, vertical cross-sectional representations of steps in the formation of the double metal, spin-on-glass device of the present invention.

Referring now more particularly to FIG. 1, there is shown an illustration of a partially completed, single field effect transistor (FET). The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 8. Then semiconductor devices can be provided in the silicon mesas according to the following processes.

The surface of the silicon substrate 10 is thermally oxidized to form the desired gate oxide 11 thickness. The preferred thickness is between about 70 to 200 Angstroms. The polysilicon layer 12 is blanket deposited by LPCVD (Low Pressure Chemical Vapor Deposition) method. The preferred thickness of the polysilicon layer 12 is between about 3000 to 4400 Angstroms. The polysilicon layer 12 is ion implanted with phosphorous or arsenic ions by conventional methods and dosages to render the polysilicon layer conductive or doped with phosphorus oxychloride at a temperature about 900° C. The surface of the layer is either thermally oxidized or a chemical vapor deposition process to form silicon oxide layer 13. The layers 11, 12 and 13 are patterned by conventional lithography and anisotropic etching techniques as are conventional in the art to provide a desired pattern of gate electrodes and structure on the FOX 8 surfaces or elsewhere as seen in FIG. 1.

The source/drain structure of the MOS FET may now be formed by the following steps. The FIG. 1 illustrates the formation of an N channel FET integrated circuit device wherein the substrate or well is doped as P—. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the device regions, typically source/drain regions 14 in the substrate as of N+ dopants. Lithographic masks may be required to protect the areas not to be subjected to that particular N ion implantation. The formation of the lithographic masks are done by conventional lithography and etching techniques. Although not illustrated for simplicity sake, lightly doped drain structures can be formed using the conventional and well known techniques.

The N+ source/drain ion implantation uses typically Arsenic, As75 with a dose of between about 1 E 15 to 6 E 15 atoms/cm.$^2$ and energy of between about 70 to 100 Kev. to complete the source/drain regions 14 of the N channel MOS FET integrated circuits device as seen in the FIG. 1.

A passivation or insulating layer 16 is now formed over the surfaces of the patterns. This layer may be composed of multilayers such as a thin layer of silicon oxide and a much thicker layer of borophophosilicate glass, phosphosilicate glass or similar insulating layer. The operational thicknesses of these layers are between about 800 to 1400 Angstroms for the oxide layer and between about 2000 to 8000 or more Angstroms for the glasseous layer. These layers are typically deposited by chemical vapor deposition in low pressure or atmospheric pressure, or in a plasma enhanced reactive chamber.

The contact windows are openings are formed through the insulating structure to the source/drain regions 14. Conventional lithography and etching techniques are used to form this pattern of openings.

The first metallurgy contact layer 20 is now deposited over the surface of the structure and within the pattern of contact openings. The metallurgy is preferably Aluminum/silicon/copper having a thickness of between about 5000 to 10,000 Angstroms. However, other possible metallurgy include titanium, titanium/-tungsten, titanium nitride or the like. The preferred method of depositing this metallurgy is by sputtering under the processing conditions of about 2 to 8 kilowatts of power, 25° to 450° C., and 0.1 to 2 Pascal. However, other possible methods of deposition include chemical vapor deposition. The metallurgy is now patterned into the desired conductive lines by conventional lithography and etching techniques to form the pattern of metal layer 20 in FIG. 1.

Figure 2:
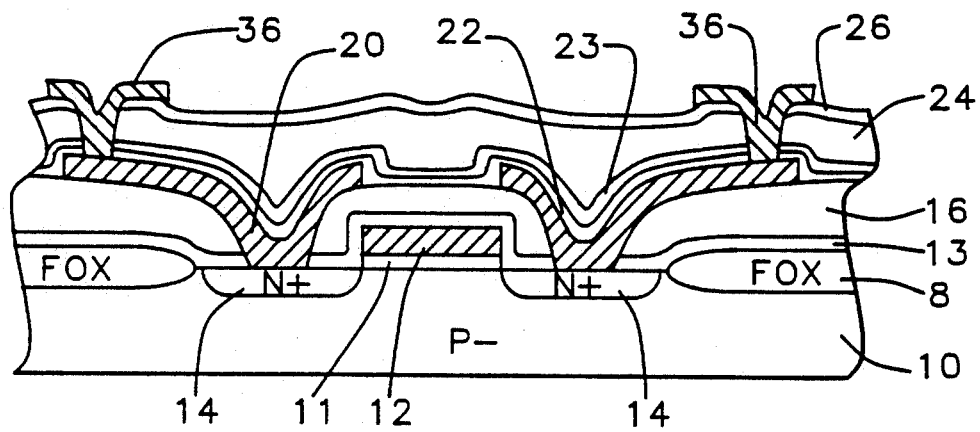

The critical processing now begins to form the important planarization and dielectric layered structure between the first metallurgy layer pattern 20 and the second metallurgy layer pattern 36 which is shown in FIG. 2.

The usual first dielectric silicon oxide layer 22 of the spin-on-glass sandwich planarization structure is now formed above the first metallurgy pattern 20. It is typically in the range of between about 1000 to 4000 Angstroms in thickness. This layer is deposited either by the silane method or by the TEOS method. The following is the silane method process conditions of pressure of about 2.95 Torr, power of about 180 watts, temperature of about 400° C., spacing of about 270 mils, silane of about 32 ccm, and dinitrogen oxide ($N_2O$) of 900 ccm. However, TEOS method is preferred to give the best step coverage over the surfaces being deposited thereon.

A dielectric barrier layer 23 is now formed over the pattern of first silicon oxide via dielectric layer 22. This layer most preferably formed by a silane and $N_2O$ process wherein the silane is oxidized with $N_2O$ to form a silicon oxide layer over the irregular or nonplanar first via layer 22 which covers the metallurgy patterned layer 20. The TEOS process is not used, because it is difficult to reach the needed high refractive index. The process gives the best possible step coverage on the first via layer 22 and metallurgy pattern 20 where the spacing between metallurgy lines is so very close. Further, the TEOS process is controlled so as to produce a silicon rich silicon oxide, $SiO_x$ wherein the x is less than 2. The preferred value of the refractive index of this barrier layer is above about 1.48 and preferably above about 1.55. As a reference point, the refractive index for silicon dioxide is 1.458 at a wavelength of 0.6328 micrometers according to A. C. Adams et al in "An Evaluation of the Prism Coupler for Measuring the Thickness and Refractive Index of Dielectric Films on Silicon Substrates" in J. Electrochem. Soc., 126, 1539 (1979). This silicon-rich silicon oxide is obtained by the process conditions of pressure of between about 2 to 4 Torr, power of 200 to 300 watts, temperature of 400° to 430° C., spacing 200 to 250 mils, silane of 40 to 100 ccm, and nitrogen dioxide of 800 to 1200 ccm. The most significant process parameter which influences the refractive index is the silane flow rate. Increasing the silane flow rate results in the required higher refractive index silicon-rich silicon oxide. The preferred thickness of this silicon oxide barrier layer 23 is between about 100 to 2500 Angstroms.

Alternatively, the silicon-rich barrier layer 23 can be silicon nitride or silicon oxynitride with a high refractive index. The determining and guiding physical characteristic is again the refractive index wherein the critical and preferred range for silicon nitride is between about 1.9 to 2.1 and for silicon oxynitride is between about 1.5 to 2.1. The silicon nitride layer is formed by the silane process under the typical conditions of power of 380 watts, pressure of 4.8 Torr, space of 480 mils, temperature of 400° C., silane flow of 130 ccm, ammonia flow of 55 ccm and nitrogen flow of 2000 to 4000 ccm. The silicon oxynitride layer is formed by the silane process under the typical conditions of power of 340 watts, pressure of 5 Torr, space of 410 mils, temperature of 400° C., silane flow of 75 ccm, ammonia flow of 50 ccm, nitrogen flow of 3500 to 4500 ccm, and dinitrogen oxide ($N_2O$) flow of 75 ccm.

The spin-on-glass materials and how they are processed are critical to the success of the process for planarization of integrated circuits as described in the above cited in the Daniel L. Yen Patent. The most useful materials are silicates-Si $(OH)_4$ and siloxanes -$(RO)nSi(OH)_{4-n}$. These types of materials are generally known and available. Examples of the silicate type is OCD Type 2 made by Tokyo Okha Corp. and siloxane type is OCD Type 6 made by Tokyo Okha Corp. It is possible to use multiple coating of spin-on-glass. Each spin-on-glass coating is less than about 0.3 micrometers and preferably between about 0.08 and 0.2 micrometers. The more coatings that are used, the better the planarity. The material to be applied is thoroughly mixed in a suitable solvent which is usually a combination of a high boiling point solvent and a low boiling point solvent.

The preferred low boiling point solvents are methanol, ethanol, and propanol. The middle boiling point solvents are buthanol, penthanol, hexanol and methyl cellosolve. The high boiling point solvents are butyl cellosolve, propylene glycol, diethylene glycol and Carbindol. Other potential vehicles or solvents are NMP, HMPA, N.N-dimethylacetoamide, acetyl acetone, and malonic acid diethylester and the like.

The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step. At this point, the critical vacuum degassing step is accomplished by subjecting the wafer to a vacuum of less than about 100 mtorr and 350 degrees C. This last step removes chemical materials which could during latter processing cause cracking and corrosion of the next level conductor material. Other coatings of the spin-on-glass material are applied, baked and vacuum degassed until the desired spin-on-glass layer is formed.

The final step in the making of the spin-on-glass layer is curing. Curing is a high temperature heating step to cause the breakdown of the silicate or siloxane material to a silicon dioxide like cross linked material. Water in the form of steam is the major reaction product of this reaction. The silicate spin-on-glass is cured at about 390° to 420° C. and siloxane spin-on-glass is cured at about 450° C. in nitrogen. The spin-on-glass layer 24 is now complete.

The second via dielectric layer 26 is now formed on top of the SOG layer 24. This layer is formed in a similar manner as was the first via layer 22. This layer can be deposited by either the TEOS or the silane method. The preferred thickness of this layer is between about 2000 to 6000 Angstroms.

Openings are now made through the second via layer 26, the SOG layer 24, barrier layer 23, the first via layer 22 to the first metallurgy layer 20. These openings are made using conventional lithography and with the preferred etching conditions at a pressure of 800 mtorrs, power of 750 watts, gap of 0.8 cm., argon flow of 400 ccm, carbon tetrafluoride flow of 23 ccm, and $CHF_3$ flow of 12 ccm.

The second metallurgy contact layer 36 is now deposited over the surface of the structure and within the pattern of contact openings to the first metallurgy layer 20. The metallurgy is preferably aluminum/silicon/copper having a thickness of between about 5000 to 11,000 Angstroms. However, other possible metallurgy include titanium, titanium/tungsten, titanium nitride or the like. The preferred method of depositing this metallurgy is by sputtering under the same processing conditions as given for the first metallurgy layer 20. However, other possible methods of deposition include chemical vapor deposition as is known in the art. The metallurgy is now patterned into the desired conductive lines by conventional lithography and etching techniques to form the pattern of metal layer 36 in FIG. 2.

The integrated circuit may now be completed with higher levels of metallurgy and passivation as is known to those skilled in the art or similar additional multilevel metallurgy layers as described above are repeated to make triple or higher metallurgy levels on the integrated circuit structure.

The following Examples are given to show the important features of the invention and to aid in the understanding thereof and variations may be made by one skilled in the art without departing from the spirit and scope of the invention.

EXAMPLES

The Examples were made using MOS field effect transistor test devices. The conditions for the silicon oxide layers—Normal silane; TEOS; and silicon-rich either TEOS or silane types—were those given in the description above. The SOG material used was the silicate type. The testing was done by forcing 5 volts on drain regions and increasing the voltage and measured the drain current, ID until $10^-$ amps. current was detected.

The following table shows the split conditions and results to illustrate the critical effect of the silicon-rich barrier dielectric layer, which is 800 Angstroms silicon-rich oxide of refractive index of 1.50 and the important improvement of the fixed charge.

| CONDITIONS | EXAMPLES | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| VIA I | | | | | | | | | | | | | | | | | | |
| NOR 3K OX. | x | x | x | | | | | | | | | | | | | | | |
| NOR 3K TEOS | | | | x | x | x | | | | | | | | | | | x | x |
| 2.5K TEOS + .8K SI-RICH OXIDE | | | | | | | x | x | | | | | x | x | | | | |
| 2.5 TEOS = .8K NOR OX. | | | | | | | | | x | x | | | | | x | x | | |
| 2.5K TEOS + .8K NITRIDE | | | | | | | | | | | x | x | | | | | | |
| VIA II | | | | | | | | | | | | | | | | | | |
| NOR OX. | x | x | x | x | x | x | x | | x | | x | | x | | x | | x | |
| SI-RICH OXIDE | | | | | | | | x | | x | | x | | x | | x | | x |
| TEST RESULTS | | | | | | | | | | | | | | | | | | |
| VTFPO,N** | | | | | | | 11 | 11 | | 11 | 11 | 11 | 11 | | | | | |
| CHIP YIELD(%)* | | | | | | | 40 | 56 | | 63 | 68 | 44 | 69 | | | | | |

*Where blank yield % is zero
**Where blank value is 10 or below

For VIA I split conditions, the VTFPO,N (poly field device N channel threshold voltage, VTH) test results show degraded devices unless there is an effective silicon-rich barrier dielectric layer between the VIA I and the SOG. Further, chip yields show strong impact of the barrier layer on yield, that is there is no yield, 0%, without the barrier layer. Both the normal NOR silane oxide process in Examples 1, 2 and 3 and TEOS oxide in Examples 4, 5, and 6 without the barrier layer failed and showed 0% yield. Also, the Examples 9 and 10 with the VIA II NOR silicon dioxide were found to have 0% yield.

Figure 3:
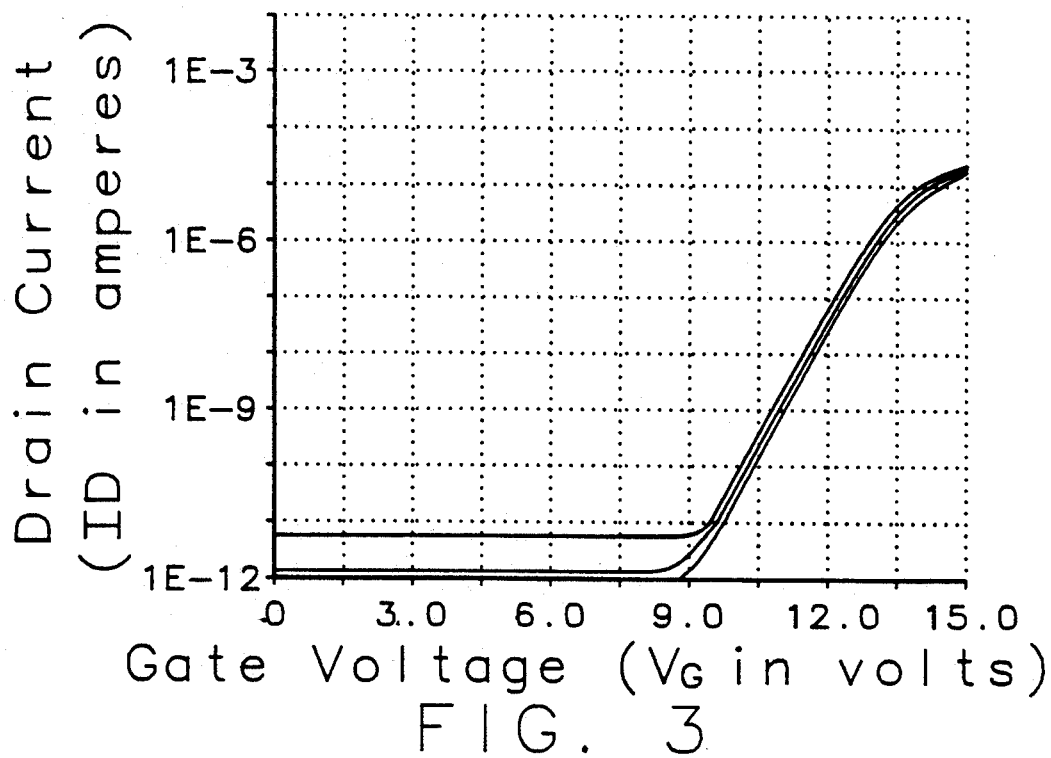
FIGS. 3 through 5 are graphical representations which show the current voltage curves for devices made by the Examples of the present invention.
Figure 4:
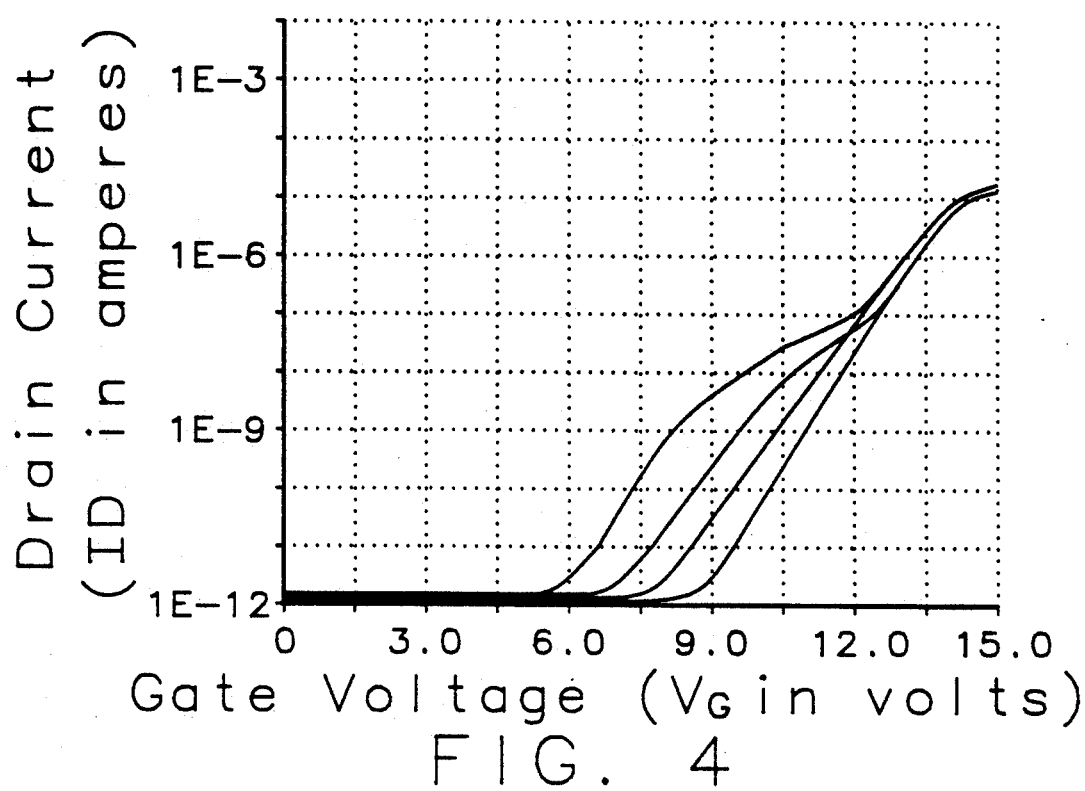
Figure 5:
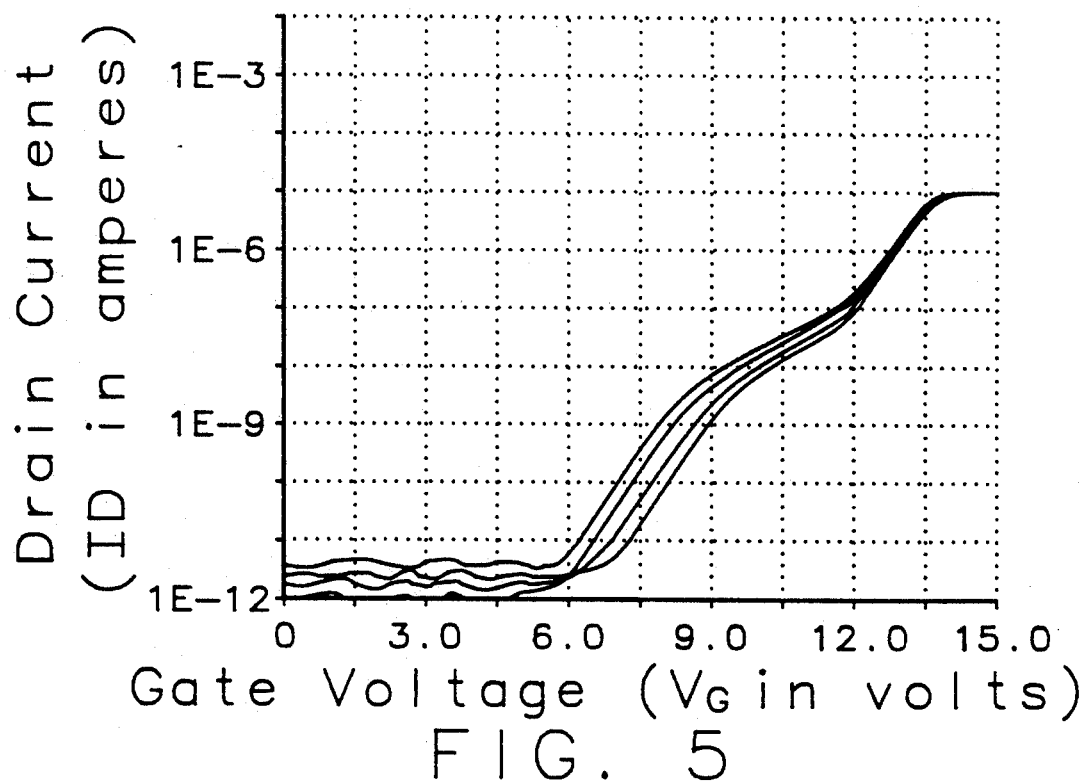

The FIG. 3 shows the I-V (current leakage to gate voltage) with the silicon-rich barrier layer present in the Example 7. The curve is a very acceptable one. The other I-V curves for Examples 8, 11, 12, 13, and 14 showed similar normal and acceptable curves. FIGS. 4 and 5 show the I-V curves without silicon-rich barrier layer, of Examples 1 and 2 in place and show a hump or initial leakage before the field device is really turned on. Curves run on the other Examples without a barrier layer show similar problems. Our failure analysis of the zero yield wafers demonstrate to be due to leakage which agree well with the I-V curves in these FIGS. 4 and 5.

While the invention has been particularly shown and described with reference to the preferred embodiments thereof, it will be understood by those skilled in the art that various changes in form and details may be made without departing from the spirit and scope of the invention.

What is claimed is:

1. A method for forming multiple metal, spin-on-glass multilayer metallurgy for a one micrometer or less feature size integrated circuit with substantially free field inversion comprising:
   providing a semiconductor substrate having a pattern of field effect device source/drain regions therein with a pattern of gate dielectric and gate electrode structures associated therewith and a pattern of field isolation structures at least partially within said semiconductor substrate electrically separating certain of these source/drain regions from one another;
   forming a passivation layer over the surfaces of said patterns; and
   forming said multilayer metallurgy thereover by opening a pattern of openings through said passivation layer to at least some of said source/drain regions,
   depositing and patterning a first metallurgy layer in contact with said pattern of openings;
   forming a first silicon oxide via dielectric layer over said pattern of first metallurgy layer;
   forming a silicon-rich barrier dielectric layer over said first via dielectric layer;
   forming a spin-on-glass layer over said barrier layer and curing the layer;
   forming a second silicon oxide via dielectric layer over said spin-on-glass layer;
   forming a pattern of openings in said second via layer, said spin-on-glass layer, said barrier layer and said first via layer; and
   depositing and patterning a second metallurgy layer in contact with said pattern of openings to make electrical contact with said first metallurgy layer wherein said multilevel metallurgy integrated circuit with substantially free field inversion is completed.

2. The method of claim 1 wherein said passivation layer is composed of a composite layer of silicon oxide and a thicker layer of borophosphosilicate glass.

3. The method of claim 2 wherein said thickness of said silicon oxide is between about 800 to 1400 Angstroms and said borophophosilicate glass is between about 2000 to 8000 Angstroms.

4. The method of claim 1 wherein said silicon-rich barrier dielectric layer is composed of at least silicon oxide $SiO_x$ where x is less than 2 and has a refractive index of greater than about 1.48.

5. The method of claim 1 wherein said barrier dielectric layer is composed of a layer of silicon oxide $SiO_x$ where x is less than 2, has a refractive index of between about 1.48 to 1.55 and the layer is formed using silane and $N_2O$.

6. The method of claim 5 wherein said barrier layer of silicon oxide has a thickness of between about 100 to 2500 Angstroms and said first via layer of silicon dioxide has a thickness of between about 1000 to 4000 Angstroms.

7. The method of claim 1 wherein said barrier dielectric layer is composed of at least silicon oxynitride, has a refractive index of between about 1.5 to 2.1 and the layer is formed using silane, a nitrogen source and $N_2O$.

8. The method of claim 1 wherein said barrier dielectric layer is composed of at least silicon nitride, has a refractive index of between about 1.9 and 2.1 and the layer is formed using silane, ammonia and nitrogen with a substantial excess of the nitrogen component in relation to the silane.

9. The method of claim 1 wherein said spin-on-glass is a silicate type material and has an unetched thickness of between about 1500 to 3500 Angstroms when said second via layer is formed thereover.

10. The method of claim 1 wherein said spin-on-glass is a siloxane type material and has an unetched thickness of between about 1500 to 3500 Angstroms when said second via layer is formed thereover.

11. The method of claim 1 wherein said first metallurgy layer is aluminum and is between about 5000 to 10,000 Angstroms in thickness and said second metallurgy layer is aluminum and is between about 5000 to 11,000 Angstroms in thickness.

12. A method for forming multiple metal, spin-on-glass multilayer metallurgy for a one micrometer or less feature size integrated circuit with substantially free field inversion on a semiconductor substrate having a pattern of device regions therein comprising:

forming a passivation layer over the surfaces of said patterns;

opening a pattern of openings through said passivation layer to at least some of said device regions which include source/drain regions, depositing and patterning a first metallurgy layer in contact with said pattern of openings;

forming a first dielectric via layer over said pattern of first metallurgy layer;

forming a silicon-rich barrier dielectric layer over the said first dielectric layer;

forming a spin-on-glass layer over said barrier layer and curing the layer;

forming a silicon oxide second via dielectric layer over said spin-on-glass layer;

forming a pattern of openings in said second via layer, said spin-on-glass layer, said barrier layer; and said first via layer; and depositing and patterning a second metallurgy layer in contact with said pattern of openings to make electrical contact with said first metallurgy layer wherein said multilevel metallurgy integrated circuit with substantially free field inversion is completed.

13. The method of claim 12 wherein said passivation layer is composed of a composite layer of silicon oxide and a thicker layer of borophosphosilicate glass; and said thickness of said silicon oxide is between about 800 to 1400 Angstroms and said borophophosilicate glass is between about 2000 to 8000 Angstroms.

14. The method of claim 12 wherein said barrier dielectric layer is composed of at least silicon oxide $SiO_x$ where x is less than 2, has a refractive index of more than about 1.48.

15. The method of claim 14 wherein said barrier dielectric layer is formed using silane and $N_2O$.

16. The method of claim 15 wherein barrier layer of silicon oxide has a thickness of between about 100 to 2500 Angstroms and said first via layer has a thickness of between about 1000 to 4000 Angstroms.

17. The method of claim 12 wherein said first barrier dielectric layer is composed of at least silicon oxynitride, has a refractive index between about 1.5 and 2.1, and the layer is formed using silane, a nitrogen source and $N_2O$.

18. The method of claim 12 wherein said spin-on-glass is a silicate type material and has an unetched thickness of between about 1500 to 3500 Angstroms when said second via layer is formed thereover.

19. The method of claim 12 wherein said spin-on-glass is a siloxane type material and has an unetched thickness of between about 1500 to 3500 Angstroms when said second via layer is formed thereover.

20. The method of claim 12 wherein said first metallurgy layer is aluminum and is between about 5000 to 10,000 Angstroms in thickness and said second metallurgy layer is aluminum and is between about 5000 to 11,000 Angstroms in thickness.

* * * * *